United States Patent
Wakabayashi

(10) Patent No.: US 11,187,912 B2
(45) Date of Patent: Nov. 30, 2021

(54) LIGHT SOURCE MODULE

(71) Applicant: SHIMADZU CORPORATION, Kyoto (JP)

(72) Inventor: Naoki Wakabayashi, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 87 days.

(21) Appl. No.: 16/531,820

(22) Filed: Aug. 5, 2019

(65) Prior Publication Data
US 2020/0044411 A1 Feb. 6, 2020

(30) Foreign Application Priority Data
Aug. 6, 2018 (JP) .............................. JP2018-147408

(51) Int. Cl.
*H01S 5/00* (2006.01)
*G02B 27/09* (2006.01)
*G02B 19/00* (2006.01)
*H01S 5/02251* (2021.01)
*H01S 5/02253* (2021.01)

(52) U.S. Cl.
CPC ..... *G02B 27/0966* (2013.01); *G02B 19/0095* (2013.01); *H01S 5/0071* (2013.01); *H01S 5/02251* (2021.01); *H01S 5/02253* (2021.01); *G02B 27/09* (2013.01); *H01S 5/005* (2013.01)

(58) Field of Classification Search
CPC ............... H01S 5/0071; H01S 5/02251; H01S 5/02253; H01S 5/4087; H01S 5/4012; H01S 5/005; G02B 19/0095; G02B 27/09; G02B 27/0966; G02B 6/4206; G02B 6/32
See application file for complete search history.

(56) References Cited

U.S. PATENT DOCUMENTS

| | | | | |
|---|---|---|---|---|
| 5,818,809 A | * | 10/1998 | Arai | ................... G11B 7/13922 369/112.24 |
| 2005/0073750 A1 | | 4/2005 | Takahashi et al. | |
| 2005/0276297 A1 | * | 12/2005 | Nishi | ................... G11B 7/1378 372/43.01 |
| 2013/0058124 A1 | * | 3/2013 | Park | ........................ G02B 6/32 362/553 |

FOREIGN PATENT DOCUMENTS

JP         2005-114977 A     4/2005

* cited by examiner

*Primary Examiner* — Xinning(Tom) Niu
(74) *Attorney, Agent, or Firm* — Sughrue Mion, PLLC

(57) ABSTRACT

A light source module includes: laser light sources; parallel light lenses that converts laser beams from the laser light sources to collimated laser beams; a demagnification optical system including that demagnifies the collimated laser beams; an optical fiber; and a condenser lens that converges and couples the laser beams demagnified by the demagnification optical system with the optical fiber; wherein an Abbe number of each of the parallel light lenses is set to a set value suppressing an output fluctuation from the optical fiber to a predetermined value or less, the set value determined based on: a transverse magnification defined by a focal length of a corresponding one of the parallel light lenses, a demagnification of the demagnification optical system, and a focal length of the condenser lens; and a corresponding one of wavelength shifts of the laser beams generated by the laser light source.

14 Claims, 10 Drawing Sheets

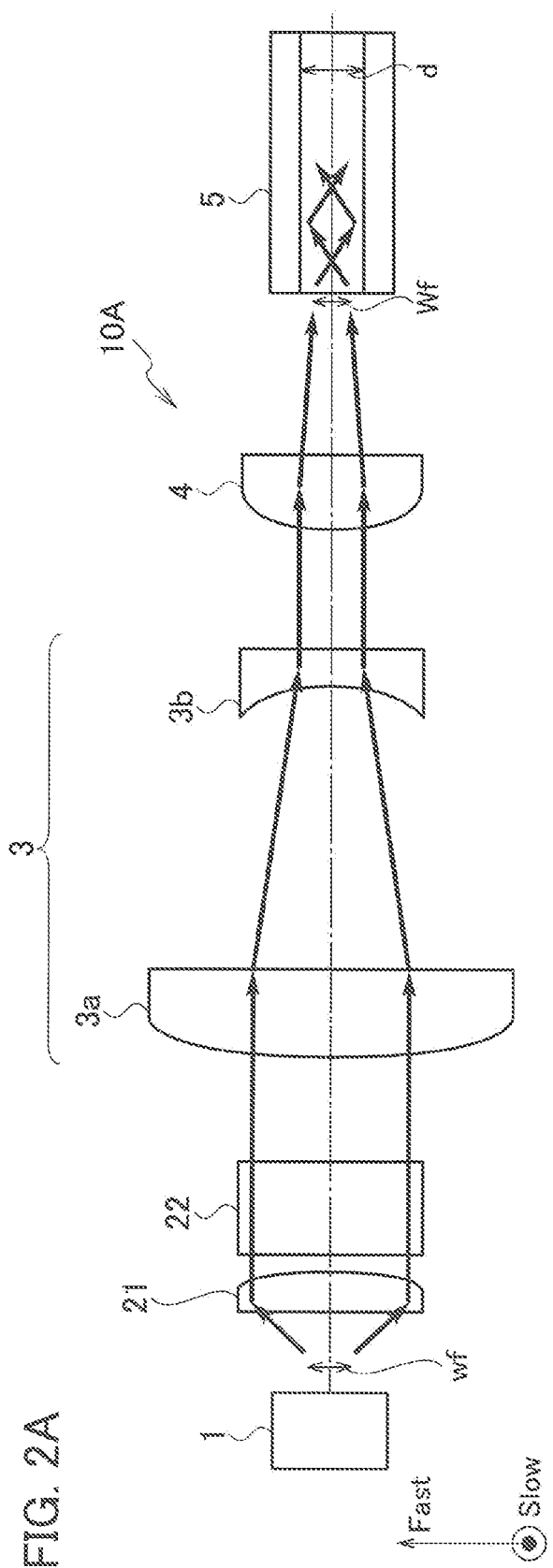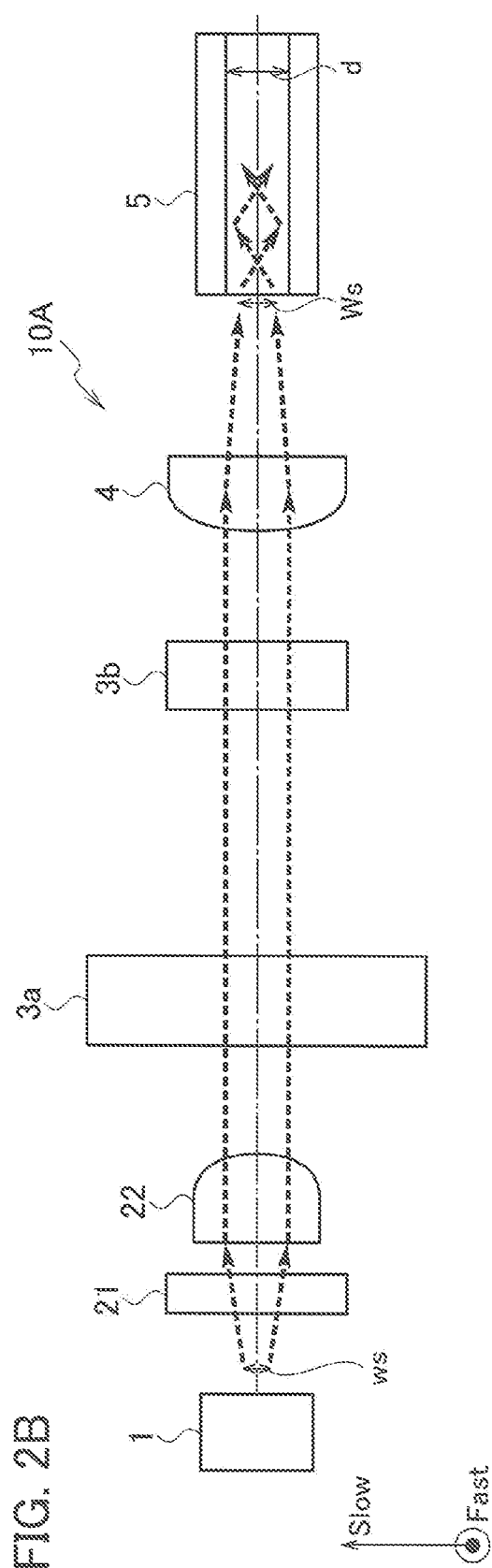

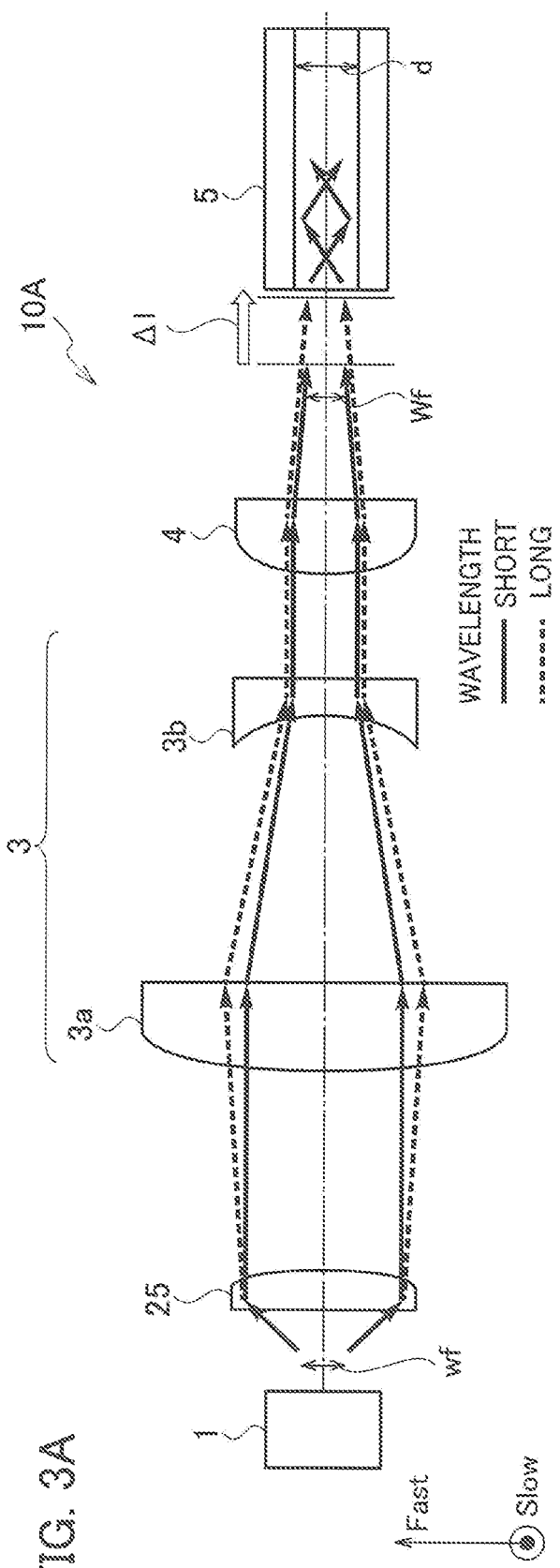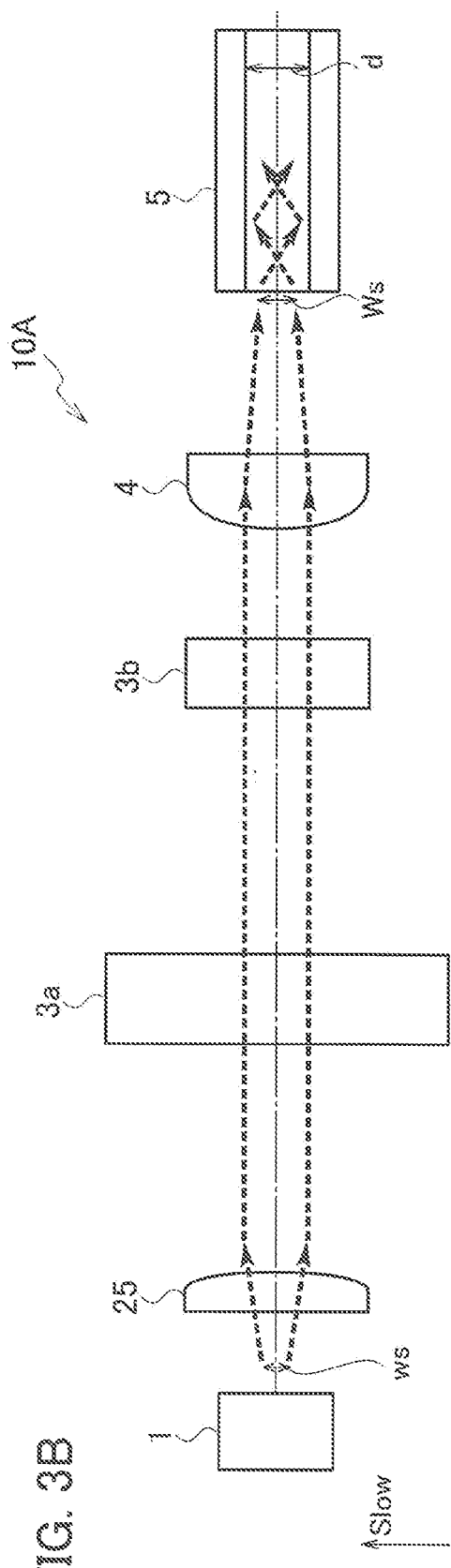

LIGHT SOURCE MODULE

CROSS REFERENCE TO RELATED APPLICATIONS

The present application claims priority to Japanese Patent Application No. 2018-147408 filed on Aug. 6, 2018, the entire contents of which are incorporated by reference herein.

BACKGROUND

1. Technical Field

The present application relates to a light source module that outputs a laser beam multiplexed from laser beams.

2. Related Art

A direct diode laser is a high power laser which output a laser beam multiplexed from laser beams emitted from diode lasers (semiconductor lasers). The laser beams from the diode lasers are multiplexed by lenses and output through a single optical fiber (refer to JP 2005-114977 A). Conventionally, direct diode lasers utilize diode lasers generating a laser beam having wavelength in the infrared region (i.e. 0.8 µm or more). However, as development of diode lasers in the visible region (especially blue diode lasers) progressed, direct diode lasers in the visible-light region have been developed.

FIG. 10 illustrates a configuration of a conventional direct diode laser. As seen in FIG. 10, the direct diode laser includes three diode lasers 1a, 1b and 1c, for example. Laser beams from the diode lasers 1a, 1b and 1c are converted to collimated beams by collimator lenses 2a, 2b and 2c, pass through the demagnification optical system 3, and converged and multiplexed into an optical fiber 5 by a condenser lens 4.

A temperature of a diode laser increases when an electric current flows therein. As illustrated in FIG. 11, with increase of the temperature, a central wavelength of the laser beam is shifted to a long-wavelength side. As illustrated in FIG. 12, a refractive index of a lens varies depending on a wavelength of the light passing therethrough and the variation of the refractive index causes a chromatic aberration. When the wavelength of the laser beam generated by the diode laser 1 shifts to the long-wavelength side, a chromatic aberration of the collimator lens 2 causes a displacement of a focal point FP of the laser beam behind the condenser lens 4, as illustrated in FIG. 13. With this chromatic aberration, a fiber coupling efficiency between the laser beam and an optical fiber varies, and consequently an output power of the laser beam from the optical fiber also varies.

The aforementioned problem can be ignored when an infrared laser is used as the laser light source in the direct diode laser. This is because the variation of the refractive index in an infrared region (i.e. the wavelength is 0.8 µm or more) is relatively small (refer to FIG. 12), and thus the variation of the fiber coupling efficiency is also relatively small, compared with a case using a laser beam in the visible-light region or the UV region.

SUMMARY

When used a diode laser generating a laser light in a range from a visible-light region or an ultraviolet (UV) region (i.e. from 0.3 µm to 0.55 µm), the variation of the refractive index of the lens becomes relatively large. In other words, a dispersion of the lens in the visible-light and UV region is larger than that in the infrared region. Therefore, in the visible-light and UV region, an effect due to the chromatic aberration is not negligible in the conventional lens.

FIG. 14 illustrates an example of a calculation which shows an output fluctuation (output power fluctuation) of a laser beam emitted from an optical fiber with respect to a wavelength shift of the laser beam generated by a diode laser. As illustrated in FIG. 14, the wavelength is longer, the variation of the output is larger. Here, vd is an Abbe number (Abbe's number) of a collimator lens. Generally, lenses having Abbe number vd of 50 or more are recognized as low-dispersion lenses, and lenses with Abbe number vd of 50 or less are recognized as high-dispersion lenses. As seen in FIG. 14, when the Abbe number vd of the lens is smaller (i.e. the dispersion of wavelength in the lens is larger), the variation of the output power becomes larger. Here, the Abbe number vd is expressed by the following formula, for example:

$$vd=(Nd-1)/(NF-NC),$$

where Nd denotes a refractive index of the lens at 0.5875618 µm, NF denotes a refractive index of the lens at 0.4861327 µm, and NC denotes a refractive index of the lens at 0.6562725 µm.

The present application is directed to provide a light source module which can reduce an output fluctuation of a direct diode laser.

An aspect of the present disclosure is a light source module including: laser light sources configured to emit laser beams; parallel light lenses configured to convert the laser beams from the laser light sources to collimated laser beams; a demagnification optical system including a convex lens and a concave lens, configured to demagnify the collimated laser beams; an optical fiber; and a condenser lens configured to converge and couple the laser beams demagnified by the demagnification optical system with the optical fiber; wherein an Abbe number of each of the parallel light lenses is set to a set value suppressing an output fluctuation from the optical fiber to a predetermined value or less, the set value determined based on: a transverse magnification defined by a focal length of a corresponding one of the parallel light lenses, a demagnification of the demagnification optical system, and a focal length of the condenser lens; and a corresponding one of wavelength shifts of the laser beams generated by the laser light source.

The laser light sources may include diode lasers having a wavelength from 0.3 µm to 0.55 µm.

The parallel light lenses may include collimator lenses.

An aspect of the present disclosure is a light source module including: laser light sources configured to emit laser beams; parallel light lenses configured to convert the laser beams from the laser light sources to collimated laser beams; an optical fiber; and a condenser lens configured to converge and couple the collimated laser beams with the optical fiber; wherein an Abbe number of each of the parallel light lenses is set to a set value suppressing an output fluctuation from the optical fiber to a predetermined value or less, the set value determined based on: a transverse magnification defined by a focal length of a corresponding one of the parallel light lenses and a focal length of the condenser lens; and a wavelength shifts of a corresponding one of the laser light source, and the parallel light lenses include collimator lenses.

Each of the collimator lenses may include: a FAC lens configured to convert the laser beam from the corresponding one of the laser light sources to a collimated laser beam in a plane including a fast-axis direction, and a SAC lens configured to convert the laser beam from the corresponding one of the laser light sources to a collimated laser beam in a plane including a slow-axis direction.

An aspect of the present disclosure is a light source module including: laser light sources configured to emit laser beams; parallel light lenses configured to convert the laser beams from the laser light sources to collimated laser beams; an optical fiber; and a condenser lens configured to converge and couple the collimated laser beams with the optical fiber; wherein an Abbe number of each of the parallel light lenses is set to a set value suppressing an output fluctuation from the optical fiber to a predetermined value or less, the set value determined based on: a transverse magnification defined by a focal length of a corresponding one of the parallel light lenses and a focal length of the condenser lens; and a wavelength shift of a corresponding one of the laser light sources, and each of the parallel light lenses includes: a FAC lens configured to convert the laser beam from the corresponding one of the laser light sources to a collimated laser beam in a plane including a fast-axis direction, and a SAC lens configured to convert the laser beam from the corresponding one of the laser light sources to a collimated laser beam in a plane including a slow-axis direction.

The Abbe numbers of the parallel light lenses may be set to a following value:

$$vd > 138.55 \times (\alpha/d) - 5.6354 \text{ when } \Delta\lambda > 1.5 \times 10^{-3} \mu m, \quad (1)$$

$$vd > 96.44 \times (\alpha/d) - 3.3878 \text{ when } 1.0 \text{ nm} < \Delta\lambda \leq 1.5 \times 10^{-3} \mu m, \quad (2)$$

$$vd > 76.22 \times (\alpha/d) - 4.007 \text{ when } 0.75 \text{ nm} < \Delta\lambda \leq 1.0 \times 10^{-3} \mu m, \quad (3)$$

$$vd > 66.19 \times (\alpha/d) - 11.823 \text{ when } 0 < \Delta\lambda \leq 0.5 \times 10^{-3} \mu m, \quad (4)$$

wherein vd denotes the Abbe numbers, α denotes the transverse magnification, d denotes a diameter of a core of the optical fiber, and Δλ denotes the wavelength shift of the corresponding one of the laser light sources.

An aspect of the present disclosure is a light source module including: light source modules according to any one of claims 1 to 7 as light source module units; a second parallel light lenses configured to convert the laser beam from the laser light sources to second collimated laser beams; a second optical fiber; and a second condenser lens configured to converge and couple the second collimated laser beams with the second optical fiber.

An Abbe number of each of the second parallel light lenses may be set to a second set value suppressing an output fluctuation from the second optical fiber to a predetermined value or less, the second set value determined based on: a transverse magnification defined by a focal length of a corresponding one of the second parallel light lenses and a focal length of the c second condenser lens; and a wavelength shift of a corresponding one of the light source module units.

According to the present disclosure, it is possible to provide a light source module which can reduce an output fluctuation of a direct diode laser.

BRIEF DESCRIPTION OF DRAWINGS

FIG. 2A illustrates a light source module according to the first embodiment of the present disclosure and an optical coupling of a laser beam with an optical fiber in the plane including a fast-axis direction when a FAC lens is used in the light source module.

FIG. 2B illustrates the light source module according to the first embodiment and an optical coupling of a laser beam with an optical fiber in the plane including a slow-axis direction when a SAC lens is used in the light source module.

FIG. 3A illustrates a light source module according to a first modification of the first embodiment and an optical coupling of a laser beam with an optical fiber in the plane including a fast-axis direction when a single collimator lens is used in the light source module.

FIG. 3B illustrates the light source module according to the first modification of the first embodiment and an optical coupling of a laser beam with an optical fiber in the plane including a slow-axis direction when the single collimator lens is used in the light source module.

DETAILED DESCRIPTION

First Embodiment

Figure 1A:
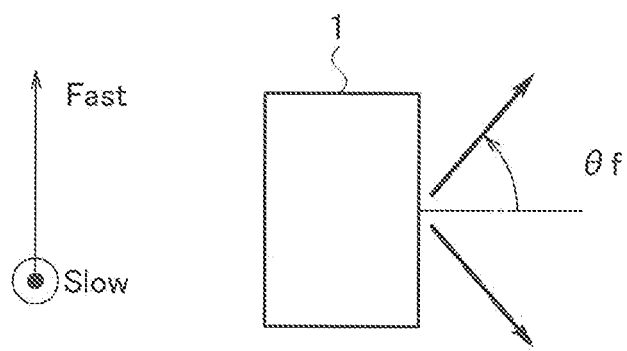
FIG. 1A illustrates a dispersion of a laser beam from a diode laser in a plane including a fast-axis direction.
Figure 1B:
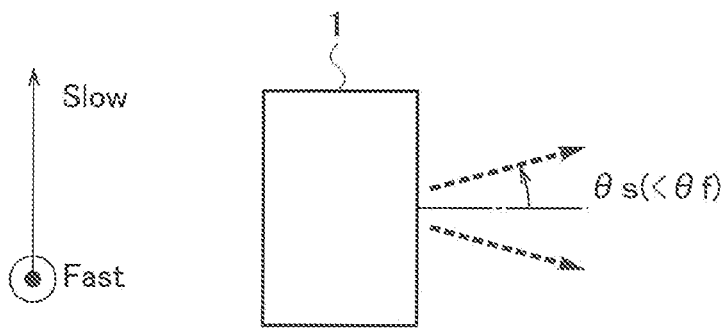
FIG. 1B illustrates a dispersion of a laser beam from a diode laser in a plane including a slow-axis direction.

FIGS. 1A and 1B illustrate dispersions of a laser beam from a diode laser 1 in two directions. FIG. 1A illustrates the dispersion of the laser beam in a fast-axis direction. Alternatively, FIG. 1B illustrates the dispersion of the laser beam in a slow-axis direction. As seen in these figures, a dispersion angle θf along the fast-axis direction is wider than a dispersion angle θs along the slow-axis direction.

FIGS. 2A and 2B illustrate a configuration of a light source module 10A according to a first embodiment of the present disclosure. FIGS. 2A and 2B illustrates an optical coupling between a laser beam emitted from a diode laser 1 and an optical fiber 5 by a FAC (i.e. fast axis collimators) lens 21 and a SAC (i.e. slow axis collimators) lens 22, as a parallel light lens. The light source module 10A includes: a diode laser 1, the FAC lens 21, the SAC lens 22, a convex lens 3a, a concave lens 3b, a condenser lens 4, and the optical fiber 5. A demagnification optical system 3 is constituted with the convex lens 3a and concave lens 3b, for example.

FIG. 2A illustrates an optical system which couples a laser beam with a size (an emission size) wf from the diode laser 1 with the optical fiber 5 in a plane including the fast-axis direction. In the plane including the fast-axis direction, the FAC lens 21 converts the laser beam emitted from the diode laser 1 to a collimated beam along an optical axis of the FAC lens 21. The demagnification optical system 3 demagnifies a size of the laser beam from the FAC lens 21. The condenser lens 4 converges (focuses) the laser beam from the demagnification optical system 3 so that the laser beam has a beam size Wf, and couples the laser beam with the optical fiber 5.

FIG. 2B illustrates an optical system which couples a laser beam with a size (an emission size) ws from the diode laser 1 with the optical fiber 5 in a plane including the slow-axis direction. In the plane including the slow-axis direction, the SAC lens 22 converts the laser beam emitted from the diode laser 1 to a collimated beam along the optical axis of the SAC lens 22. The demagnification optical system 3 demagnifies a size of the laser beam from the SAC lens 22. The condenser lens 4 converges the laser beam from the demagnification optical system 3 so that the laser beam has a beam size Ws, and couples the laser beam with the optical fiber 5.

As described above, the laser beam emitted from the diode laser 1 in the plane including the fast-axis direction is converted into the laser beam along the optical axis in the same plane by the FAC lens 21. Similarly, the laser beam emitted from the diode laser 1 in the plane including the slow-axis direction is converted into the laser beam along the optical axis in the same plane by the SAC lens 22 which is separately provided from the FAC lens 21.

As illustrated in FIGS. 3A and 3B, the laser beam from the diode laser 1 may be converted by a collimator lens 25 into the collimated beam along the optical axis in the aforementioned two planes. The collimator lens 25 is a single optical component as a parallel light lens, and the collimated beam converted by the collimator lens 25 may be coupled with the optical fiber 5.

Figure 4:
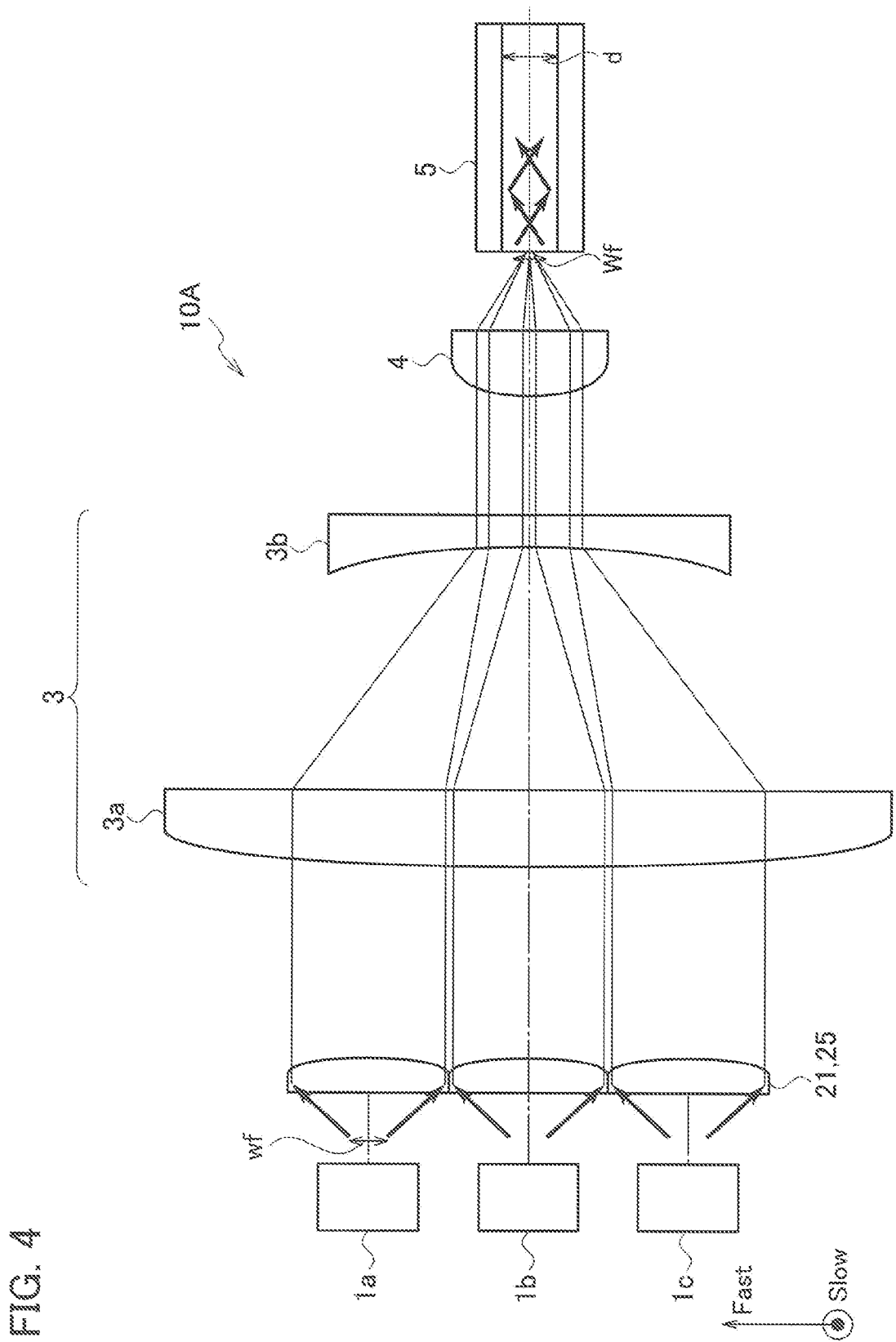
FIG. 4 illustrates a light source module according to a second modification of the first embodiment and an optical coupling of laser beams with an optical fiber in the plane including a fast-axis direction, wherein the laser beams emitted from diode lasers arranged in the fast-axis direction.

A direct diode laser is a high power laser, in general, accomplished by coupling laser beams generated by diode lasers arranged in at least one direction of the fast-axis direction and the slow-axis direction. FIG. 4 illustrates an example of the direct diode laser in which three diode lasers 1a, 1b and 1c as laser light sources are arranged in the fast-axis direction and three FAC lenses 21 or three collimator lenses 25 to couple the laser beams with the optical fiber 5. It should be noted that the number of the diode lasers is not limited to three and may be two, four or more.

Each of the diode lasers 1a, 1b and 1c outputs a laser beam having a wavelength from 0.3 μm to 0.55 μm, for example. Each of the FAC lenses 21 or the collimator lenses 25 is arranged to a corresponding one of the diode lasers 1a, 1b and 1c. Each FAC lens 21 or collimator lens 25 converts the laser beam emitted from the corresponding one of the diode lasers 1a, 1b and 1c to a collimated beam along the optical axis. The condenser lens 4 converges the demagnified laser beams by the concave lens 3b, and couples them with the optical fiber 5.

FIG. 3A illustrates a displacement of a focal point when the wavelength of the laser beam from the diode laser 1 is shifted to the long wavelength side, that is, when the wavelength is increased. In FIG. 3A, solid lines represents a laser beam with a short wavelength, and broken lines represents a laser beam with a long wavelength which is longer than that of the laser beam as shown by the solid lines. The focal point of a laser beam is displaced away from the condenser lens 4 by a displacement Δl when the wavelength of the laser beam is increased. In general, the displacement Δl is represented by the following formula (1):

$$\Delta l \propto \alpha^2 \quad (1),$$

where α denotes a transverse magnification (lateral magnification). That is, the displacement Δl is proportional to the square of the transverse magnification α. The transverse magnification α in the optical system as shown in FIG. 3A is represented by the following formula (2):

$$\alpha = F1/F2 \times F3/F_f \times A \quad (2),$$

where F1 denotes a focal length of the convex lens 3a, F2 denotes a focal length of the concave lens 3b, F3 denotes a focal length of the condenser lens 4, Ff denotes a focal length of the collimator lens 25 or the FAC lens 21, and (F1/F2) is a demagnification of the demagnification optical system 3.

The coefficient 'A' in formula (2) represents a beam divergence at the focal point due to an aberration. An optical system having the coefficient 'A' of 1 represents a stigmatic optical system. As understood from formula (1), when the transverse magnification α is larger, the positional variation of the focal point is larger.

When the wavelength of the laser beam from the diode laser 1 varies, the refractive index of the collimator lens 25 also varies. In this case, a displacement δFf of the focal point Ff of the condenser lens 4 is represented by the following formula:

$$\delta F_f = F_f / vd \quad (3),$$

where vd denotes an Abbe number of the collimator lens 25. As understood from formula (3), when the Abbe number is larger, the displacement δFf is smaller. Further, when the displacement δFf is smaller, the displacement Δl is smaller from formulae (1) and (2). Accordingly, it is required to use the collimator lens 25 having a relatively large Abbe number vd in order to reduce the displacement Δl due to the chromatic aberration.

When the displacement Δl varies, the fiber coupling efficiency varies, thereby the output power from the optical fiber varies. For this reason, it is required to increase the Abbe number vd of the collimator lens 25 to reduce such output fluctuation.

Figure 5:
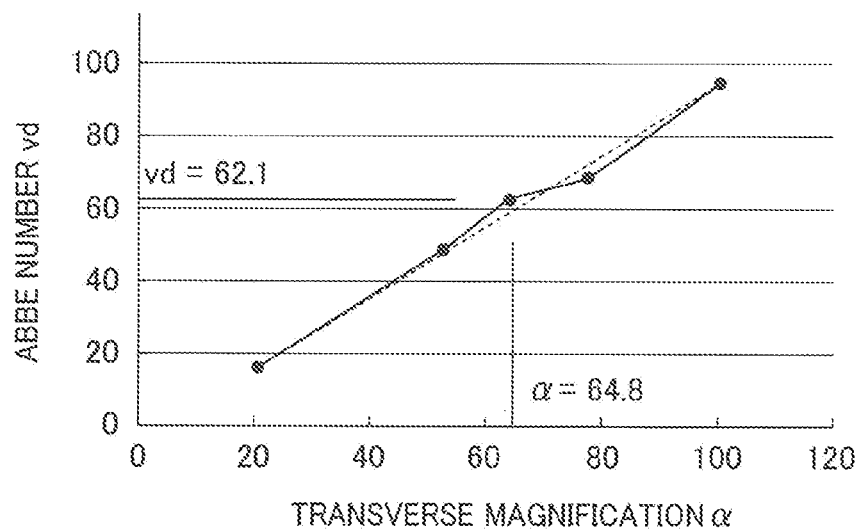
FIG. 5 illustrates a graph showing a relation between the transverse magnifications and the Abbe numbers of the collimator lens in which the output fluctuation reaches 5% when a diameter of a core of an optical fiber is 100 μm and an emission size of the diode laser is 0.9 μm.

In the present disclosure, Abbe numbers which reduces the output power have been calculated with respect to the transverse magnifications α when a diameter d of the core of the optical fiber 5 is 100 μm, an emission size wf of the laser beam in the fast-axis direction is 0.9 μm. FIG. 5 is a graph showing a relation between the transverse magnifications α and the Abbe numbers in which the output fluctuation reaches 5% when the wavelength of 0.448 μm of the laser beam from the diode laser is shifted by +1.00 nm.

Figure 6:
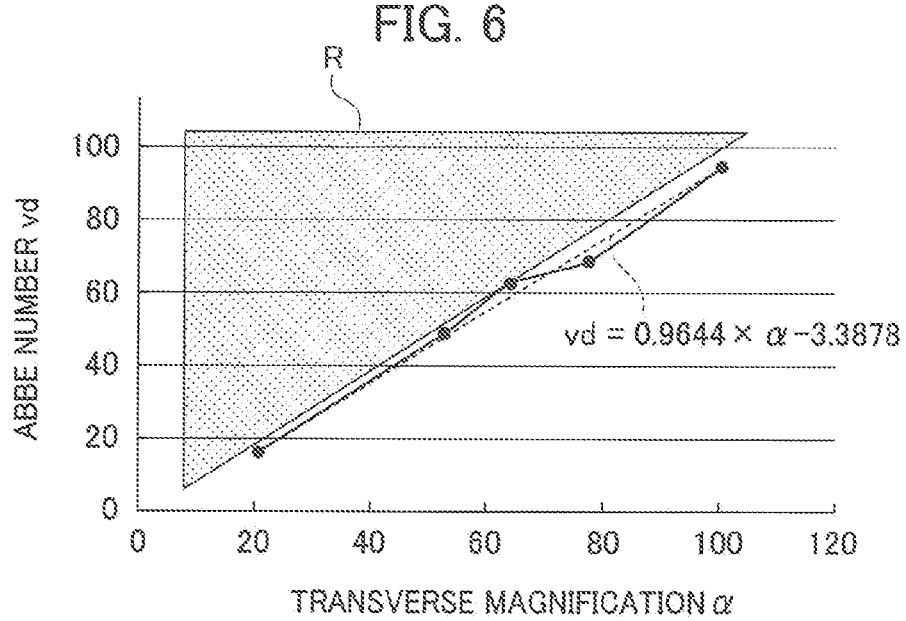
FIG. 6 illustrates an area in which the output fluctuation reaches 5% together with the graph of FIG. 5.

For example, in FIG. 5, when the transverse magnifications α is 64.8, the Abbe number vd is 62.1. In this case, when the output power is supposed to be 100 W and the wavelength is supposed to be shifted from 0.448 µm to 0.449 µm, the output power is decreased from 100 W to 95 W, in other words, the output power is fluctuated by 5%. In order to suppress the fluctuation (reduction) of the output power to be 5% or less, the collimator lens 25 having the Abbe number vd in a dot-hatched area R in FIG. 6 may be used. That is, the collimator lens 25 having the Abbe number vd fulfilling the following formula may be used, $$vd>0.9644\times\alpha-3.3878.$$

It should be noted that the collimator lens 25 may be the FAC lens 21 or a spherical lens.

Figure 7:
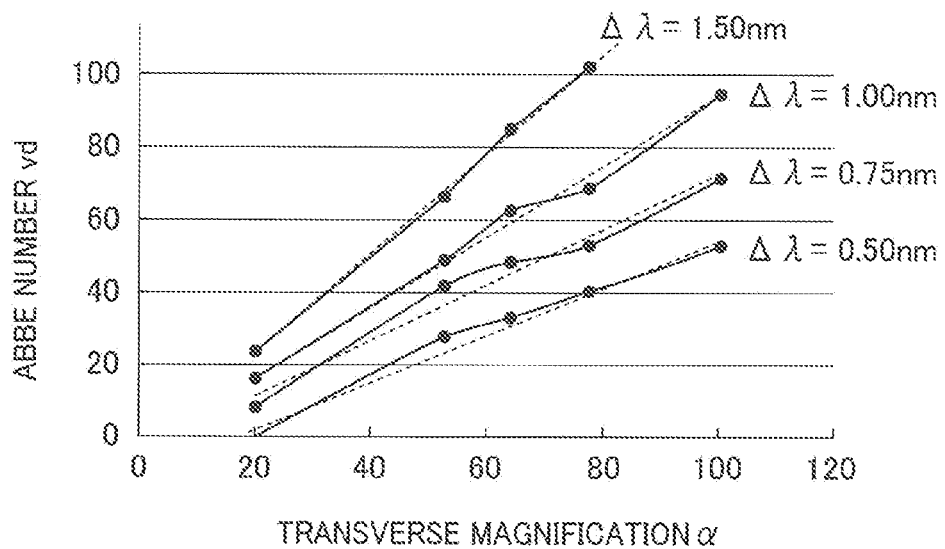
FIG. 7 illustrates graphs showing a relation between the transverse magnifications and the Abbe numbers of the collimator lens in which the output fluctuation reaches 5% when a diameter of a core of an optical fiber is 100 μm and an emission size of the diode laser is 0.9 μm.

FIG. 7 is a graph showing a relation between the transverse magnifications α and the Abbe numbers in which the output fluctuation reaches 5% when the wavelength of 0.448 µm of the laser beam from the diode laser is shifted by +0.5 nm, +0.75 nm, and +1.5 nm as well as the case where the wavelength shift Δλ=+1.00 nm.

As shown in FIG. 7, when the wavelength shift Δλ is larger, a gradient (vd/α) is larger. Therefore, it is required to use a lens having an Abbe number vd which is large enough to reduce the output fluctuation from the optical fiber.

When the direct diode laser emitting blue laser light (i.e. 0.448 µm) is used for laser machining, a fluctuation of an output power from the optical fiber 5 is required to be 5% or less. Accordingly, in order to suppress the output fluctuation to 5% or less, the Abbe number vd has to be determined from the graph of FIG. 6 with respect to the wavelength shift Δλ and transverse magnifications α.

An available range of the Abbe number vd of the collimator lens 25 with respect to the wavelength shift Δλ can be determined based on the graph of FIG. 7, as follows.

$$vd>138.55\times\alpha-5.6354 \text{ when } \Delta\lambda>1.5\times10^{-3} \text{ µm} \quad (1)$$

$$vd>96.44\times\alpha-3.3878 \text{ when } 1.0 \text{ nm}<\Delta\lambda\leq1.5\times10^{-3} \text{ µm} \quad (2)$$

$$vd>76.22\times\alpha-4.007 \text{ when } 0.75 \text{ nm}<\Delta\lambda\leq1.0\times10^{-3} \text{ µm} \quad (3)$$

$$vd>66.19\times\alpha-11.823 \text{ when } 0<\Delta\lambda\leq0.5\times10^{-3} \text{ µm} \quad (4)$$

FIG. 7 is a graph showing a result of calculation when the diameter d is set to 100 µm and the emission size wf of the diode laser in the fast-axis direction is set to 0.9 µm. Generally, a diameter d of a core of the optical fiber is determined by the emission size of the diode laser and the number of the diode laser used.

Figure 8:
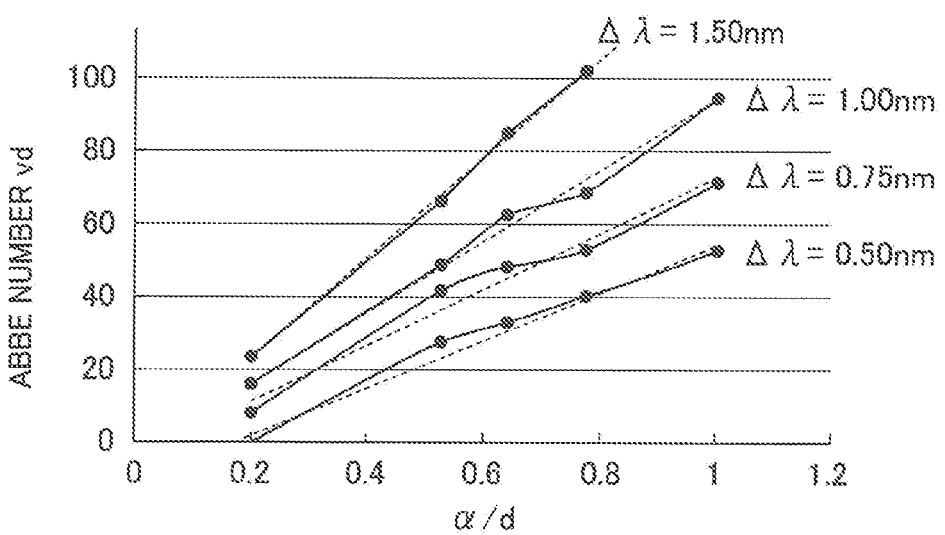
FIG. 8 illustrates graphs showing a relation between the transverse magnifications normalized by a diameter of a core of an optical fiber and the Abbe numbers of the collimator lens in which the output fluctuation reaches 5%.

FIG. 8 is a graph showing values normalized by a diameter d of a core of an optical fiber from values in FIG. 7. From FIG. 8, an available range of the Abbe number vd of the collimator lens 25 when α×ws<d and α×wf<d can be determined as follows. Here, the available range is a range fulfilling that the output fluctuation is 5% or less.

$$vd>138.55\times(\alpha/d)-5.6354 \text{ when } \Delta\lambda>1.5\times10^{-3} \text{ µm} \quad (1)$$

$$vd>96.44\times(\alpha/d)-3.3878 \text{ when } 1.0 \text{ nm}<\Delta\lambda\leq1.5\times10^{-3} \text{ µm} \quad (2)$$

$$vd>76.22\times(\alpha/d)-4.007 \text{ when } 0.75 \text{ nm}<\Delta\lambda\leq1.0\times10^{-3} \text{ µm} \quad (3)$$

$$vd>66.19\times(\alpha/d)-11.823 \text{ when } 0<\Delta\lambda\leq0.5\times10^{-3} \text{ µm} \quad (4)$$

According to the first embodiment, the Abbe number vd of the collimator lens 25 is set to a set value which suppresses the output fluctuation from the optical fiber 5 to a predetermined value (5%) or less. The set value is determined based on: the transverse magnification α defined by the focal length of the collimator lens 25, the demagnification of the demagnification optical system 3, and the focal length of the condenser lens 4; and the wavelength shifts Δλ of the laser beams generated by the diode laser 1a, 1b and 1c. With the setting of the Abbe number vd as described above, it is possible to reduce the output fluctuation of the light source module.

In the present embodiment, as described above, the collimator lens 25 may be replaced to the FAC lens 21 or the SAC lens 22. Therefore, the collimator lens 25 may be replaced to the FAC lens 21 or the SAC lens 22 in definition of the transverse magnification α as described above. In these cases, it is also possible to reduce the output fluctuation of the light source module.

In addition, with setting of the Abbe number vd of the collimator lens 25 as described above, it is possible to reduce the output fluctuation from the optical fiber 5 to 5% or less.

In the embodiment as shown in FIGS. 2A to 4, the demagnification optical system 3 may be omitted. For example, when the demagnification optical system 3 is omitted and the collimator lens 25 is provided in the embodiment as shown in FIGS. 3A, 3B and 4, the Abbe number of the collimator lens 25 is set based on: the transverse magnification α defined by the focal length of the collimator lens 25 and the focal length of the condenser lens 4; and the wavelength shift Δλ of the laser beam generated by the diode laser 1 to suppress the output fluctuation from the optical fiber 5 to the predetermined value.

As described above, even in the embodiment without the demagnification optical system 3, with the setting of the Abbe number vd of the collimator lens 25 as described above, it is possible to reduce the output fluctuation from the optical fiber 5 to 5% or less.

Further, when the demagnification optical system 3 is omitted and the FAC lens 21 and the SAC lens 22 are provided in the embodiment as shown in FIGS. 3 A, 3B and 4, the Abbe number of the FAC lens 21 is set to a set value which suppresses the output fluctuation from the optical fiber 5 to the predetermined value. The set value is determined based on: the transverse magnification α defined by the focal length of the FAC lens 21 and the focal length of the condenser lens 4; and the wavelength shift Δλ of the laser beam generated the diode laser 1. In addition, the Abbe number of the SAC lens 22 is set to a set value which suppresses the output fluctuation from the optical fiber 5 to the predetermined value. The set value is determined based on: the transverse magnification α defined by the focal length of the SAC lens 22 and the focal length of the condenser lens 4; and the wavelength shift Δλ of the laser beam generated by the diode laser 1.

As described above, even in the embodiment without the demagnification optical system 3, with the setting of the Abbe numbers vd of the FAC lens 21 and the SAC lens 22 as described above, it is possible to reduce the output fluctuation from the optical fiber 5 to 5% or less.

Second Embodiment

Figure 9:
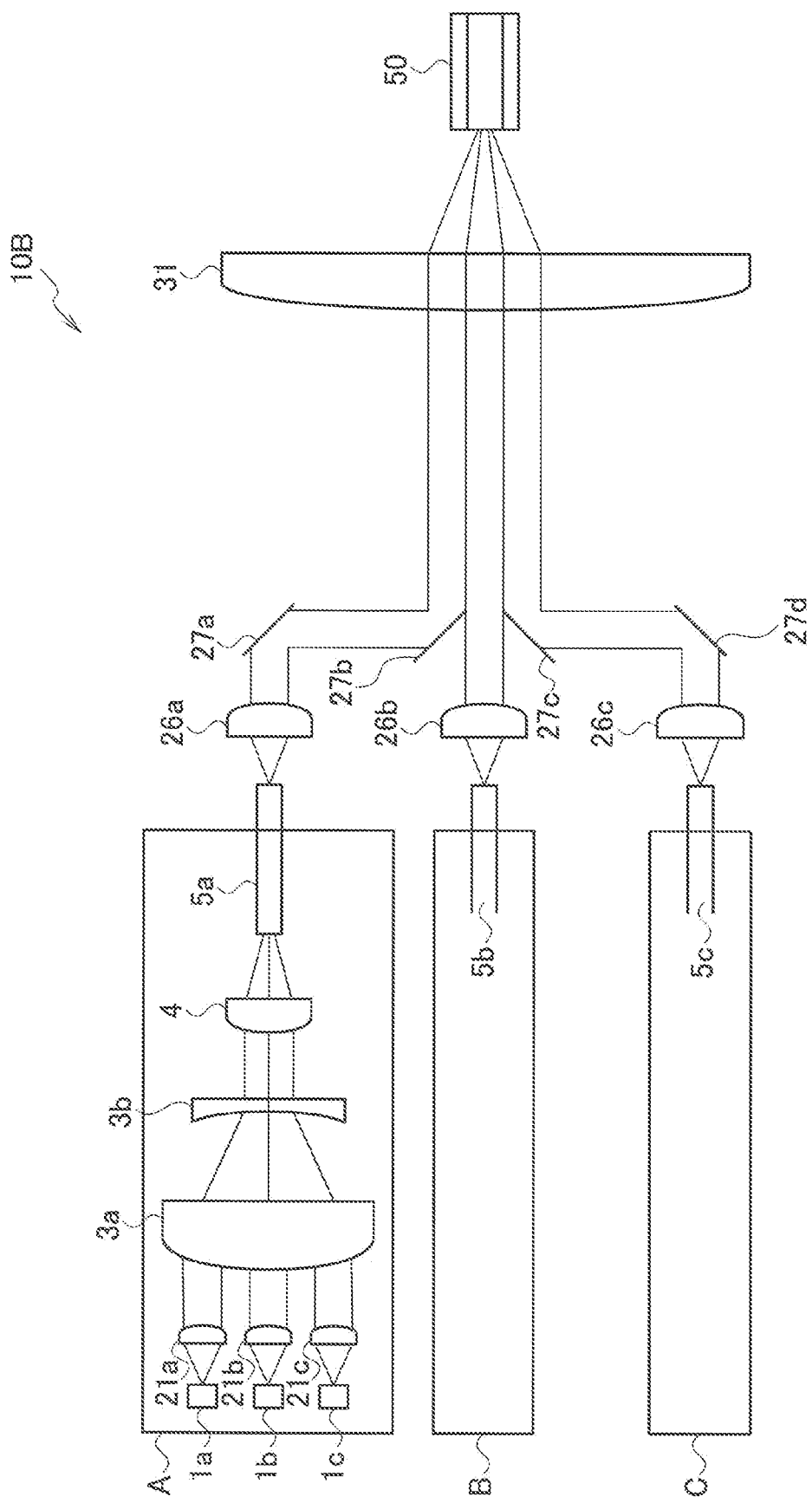
FIG. 9 illustrates a configuration of a light source module according to a second embodiment of the present disclosure.
Figure 10:
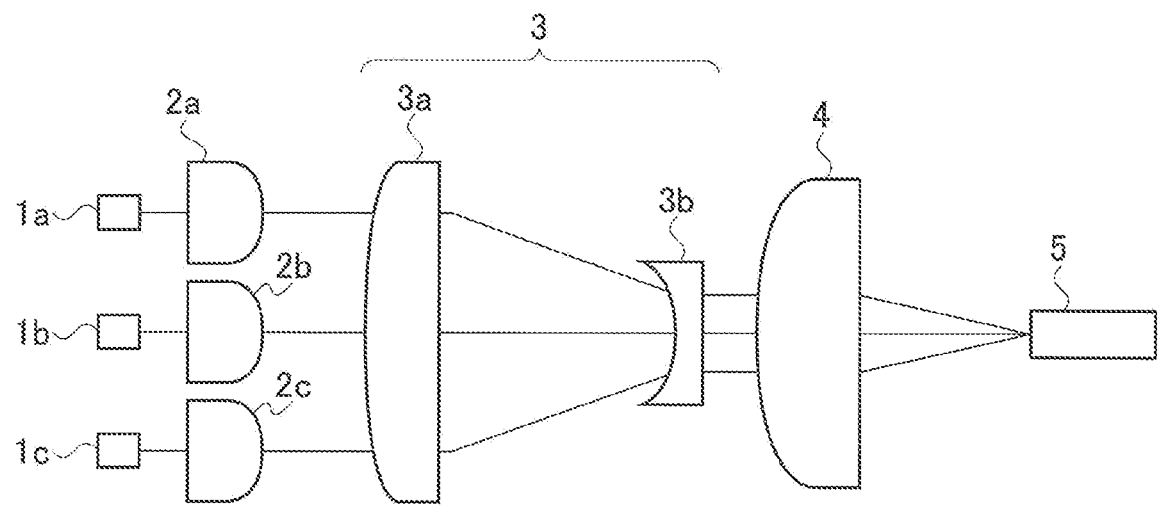
FIG. 10 illustrates a configuration of a conventional direct diode laser.
Figure 11:
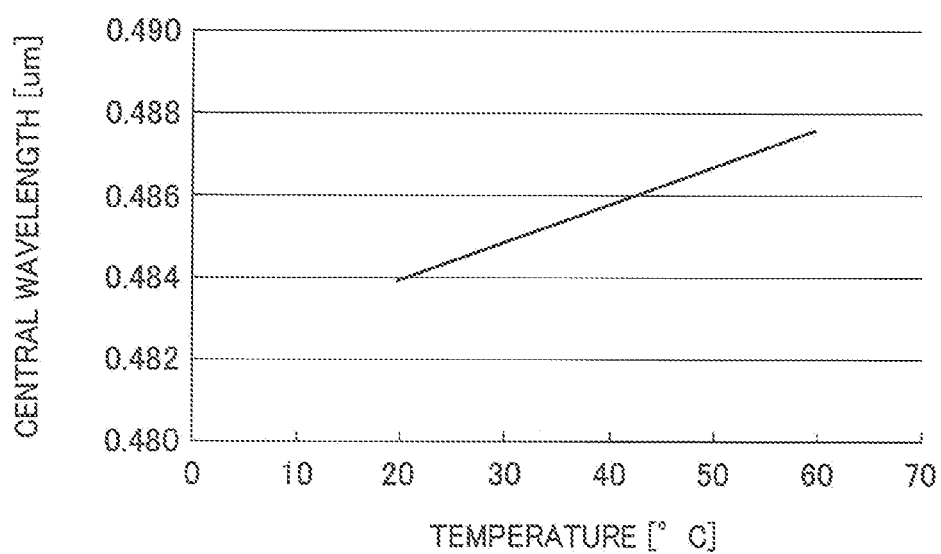
FIG. 11 illustrates a shift of a central wavelength of a laser beam with respect to a temperature of a diode laser.
Figure 12:
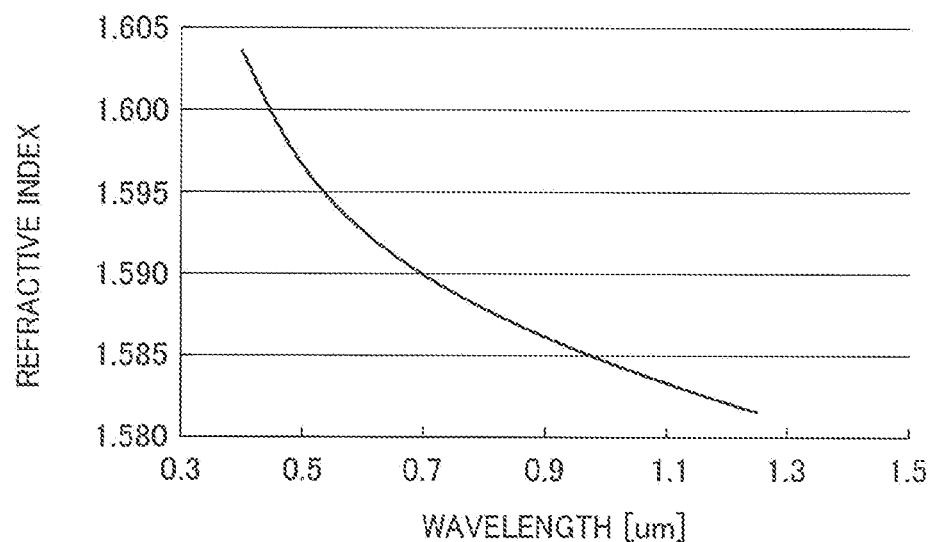
FIG. 12 illustrates an example of a variation of a refractive index of a glass with respect to a wavelength of light.
Figure 13:
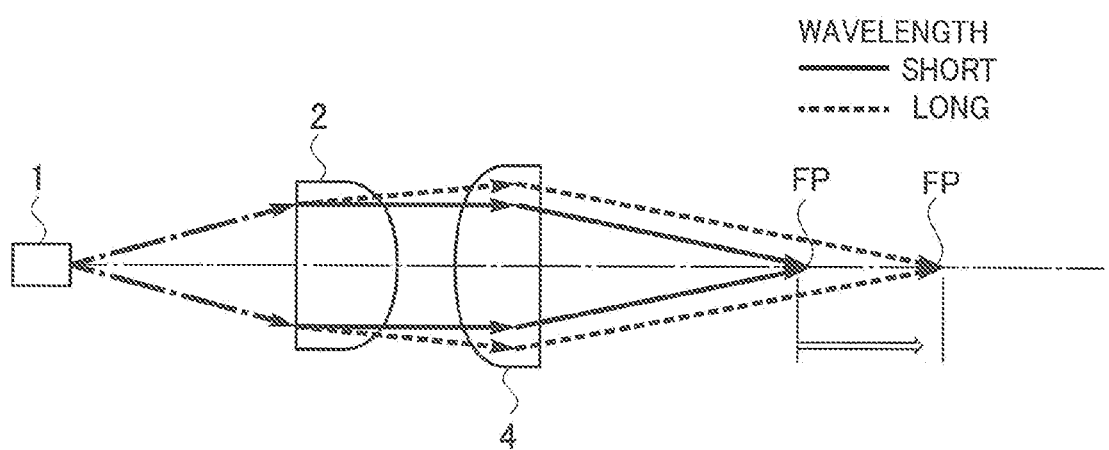
FIG. 13 illustrates a displacement of a focal point due to a shift of a wavelength of light generated by a diode laser from a short-wave side to a long-wave side.
Figure 14:
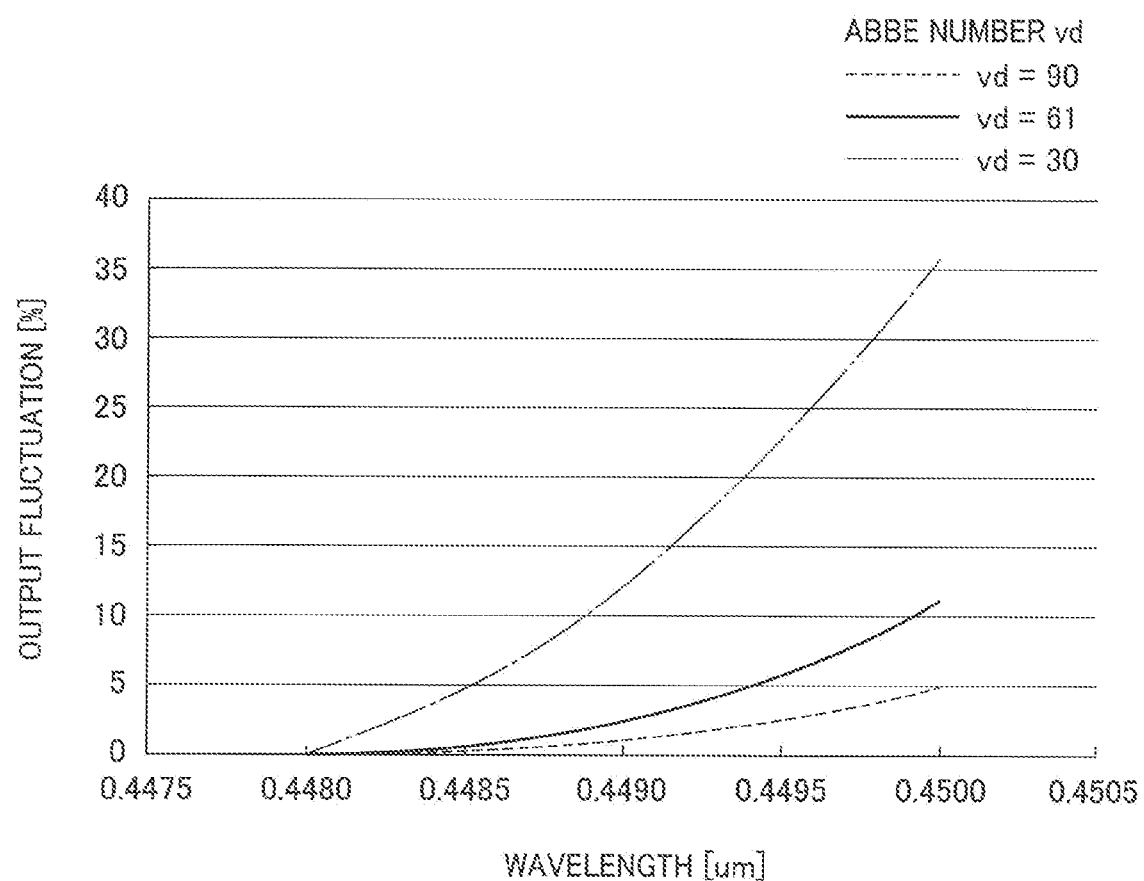
FIG. 14 illustrates a calculation example of an output fluctuation due to a shift of the wavelength of light generated by a diode laser.

FIG. 9 illustrates a configuration of a light source module 10B according to a second embodiment of the present disclosure. As seen in FIG. 9, the light source module 10B includes the light source modules 10A according to the first embodiment as light source units A, B and C. Here, the number of the light source units is not limited to three, and may be two, four or more.

The light source module 10B includes collimator lenses 26a, 26b and 26c as second parallel light lenses, and a condenser lens (a second condenser lens) 31. Each of the collimator lenses 26a, 26b and 26c is provided between the condenser lens 31 and each of light source units A, B and C. The light source module 10B may include an optical element which narrows a gap between laser beams from the optical module units. The optical element may include mirrors 27a, 27b, 27c and 27d as illustrated in FIG. 9, otherwise may be a demagnification optical system 3 as used in the first embodiment, for example.

The collimator lens 26a converts a laser beam emitted from the light source unit A to a collimated beam. The collimator lens 26b converts a laser beam emitted from the light source unit B to a collimated beam. The collimator lens 26c converts a laser beam emitted from the light source unit C to a collimated beam. The condenser lens 31 converges (focuses) the collimated beams from collimator lens 26a, 26b and 26c and couples them with an optical fiber (second optical fiber) 50.

The Abbe number vd of collimator lens 26a is set to a set value determined based on: the transverse magnification $\alpha$ defined by the focal length of the collimator lens 26a and the focal length of the condenser lens 31; and the wavelength shift $\Delta\lambda$ of the laser beam generated by the diode laser 1a (see FIG. 4) in the light source unit A. The Abbe numbers vd of the collimator lenses 26b and 26c are set in the same manner.

According to the second embodiment, the laser beams from the light source units A, B and C are converged and coupled with the optical fiber 50. Accordingly, it is possible to further increase the output power of the laser beam.

In addition, the Abbe numbers of the FAC lenses 21a, 21b and 21c in the light source units A, B and C, the collimators lenses 26a, 26b and 26c are set to set values in the same manner as described in the first embodiment. Accordingly, it is possible to reduce the output fluctuation from the optical fiber 5 to 5% or less.

What is claimed is:

1. A light source module comprising:
laser light sources configured to emit laser beams;
parallel light lenses configured to convert the laser beams from the laser light sources to collimated laser beams;
a demagnification optical system including a convex lens and a concave lens, configured to demagnify the collimated laser beams;
an optical fiber; and
a condenser lens configured to converge and couple the laser beams demagnified by the demagnification optical system with the optical fiber; wherein
an Abbe number of each of the parallel light lenses is set to a set value suppressing an output fluctuation from the optical fiber to a predetermined value or less, the set value determined based on: a transverse magnification defined by a focal length of a corresponding one of the parallel light lenses, a demagnification of the demagnification optical system, and a focal length of the condenser lens; and a corresponding one of wavelength shifts of the laser beams generated by the laser light sources.

2. The light source module according to claim 1, wherein the laser light sources comprise diode lasers having a wavelength from 0.3 μm to 0.55 μm.

3. The light source module according to claim 1, wherein the parallel light lenses comprise collimator lenses.

4. The light source module according to claim 2, wherein the parallel light lenses comprise collimator lenses.

5. A light source module comprising:
laser light sources configured to emit laser beams;
parallel light lenses configured to convert the laser beams from the laser light sources to collimated laser beams;
an optical fiber; and
a condenser lens configured to converge and couple the collimated laser beams with the optical fiber; wherein
an Abbe number of each of the parallel light lenses is set to a set value suppressing an output fluctuation from the optical fiber to a predetermined value or less, the set value determined based on: a transverse magnification defined by a focal length of a corresponding one of the parallel light lenses and a focal length of the condenser lens; and a wavelength shifts of a corresponding one of the laser light sources, and
the parallel light lenses comprise collimator lenses.

6. The light source module according to claim 5, wherein each of the collimator lenses comprises:
a FAC lens configured to convert the laser beam from the corresponding one of the laser light sources to a collimated laser beam in a plane including a fast-axis direction, and
a SAC lens configured to convert the laser beam from the corresponding one of the laser light sources to a collimated laser beam in a plane including a slow-axis direction.

7. The light source module according to claim 1, wherein the Abbe numbers of the parallel light lenses are set to a following value:

$$vd > 138.55 \times (\alpha/d) - 5.6354 \text{ when } \Delta\lambda > 1.5 \times 10^{-3} \text{ μm}, \quad (1)$$

$$vd > 96.44 \times (\alpha/d) - 3.3878 \text{ when } 1.0 \text{ nm} < \Delta\lambda \leq 1.5 \times 10^{-3} \text{ μm}, \quad (2)$$

$$vd > 76.22 \times (\alpha/d) - 4.007 \text{ when } 0.75 \text{ nm} < \Delta\lambda \leq 1.0 \times 10^{-3} \text{ μm}, \quad (3)$$

$$vd > 66.19 \times (\alpha/d) - 11.823 \text{ when } 0 < \Delta\lambda \leq 0.5 \times 10^{-3} \text{ μm}, \quad (4)$$

wherein vd denotes the Abbe numbers, $\alpha$ denotes the transverse magnification, d denotes a diameter of a core of the optical fiber, and $\Delta\lambda$ denotes the wavelength shift of the corresponding one of the laser light sources.

8. The light source module according to claim 2, wherein the Abbe numbers of the parallel light lenses are set to a following value:

$$vd > 138.55 \times (\alpha/d) - 5.6354 \text{ when } \Delta\lambda > 1.5 \times 10^{-3} \text{ μm}, \quad (1)$$

$$vd > 96.44 \times (\alpha/d) - 3.3878 \text{ when } 1.0 \text{ nm} < \Delta\lambda \leq 1.5 \times 10^{-3} \text{ μm}, \quad (2)$$

$$vd > 76.22 \times (\alpha/d) - 4.007 \text{ when } 0.75 \text{ nm} < \Delta\lambda \leq 1.0 \times 10^{-3} \text{ μm}, \quad (3)$$

$$vd > 66.19 \times (\alpha/d) - 11.823 \text{ when } 0 < \Delta\lambda \leq 0.5 \times 10^{-3} \text{ μm}, \quad (4)$$

wherein vd denotes the Abbe numbers, $\alpha$ denotes the transverse magnification, d denotes a diameter of a core of the optical fiber, and $\Delta\lambda$ denotes the wavelength shift of the corresponding one of the laser light sources.

9. The light source module according to claim 3, wherein the Abbe numbers of the parallel light lenses are set to a following value:

$$vd > 138.55 \times (\alpha/d) - 5.6354 \text{ when } \Delta\lambda > 1.5 \times 10^{-3} \text{ μm}, \quad (1)$$

$$vd > 96.44 \times (\alpha/d) - 3.3878 \text{ when } 1.0 \text{ nm} < \Delta\lambda \leq 1.5 \times 10^{-3} \text{ μm}, \quad (2)$$

$$vd > 76.22 \times (\alpha/d) - 4.007 \text{ when } 0.75 \text{ nm} < \Delta\lambda \leq 1.0 \times 10^{-3} \text{ μm}, \quad (3)$$

$$vd > 66.19 \times (\alpha/d) - 11.823 \text{ when } 0 < \Delta\lambda \leq 0.5 \times 10^{-3} \text{ μm}, \quad (4)$$

wherein vd denotes the Abbe numbers, $\Delta$ denotes the transverse magnification, d denotes a diameter of a core of the optical fiber, and $\Delta\lambda$ denotes the wavelength shift of the corresponding one of the laser light sources.

10. A light source module comprising:
light source modules according to claim 1 as light source module units;
a second parallel light lenses configured to convert the laser beam from the laser light sources to second collimated laser beams;
a second optical fiber; and
a second condenser lens configured to converge and couple the second collimated laser beams with the second optical fiber.

11. A light source module comprising:
light source modules according to claim 5 as light source module units;
a second parallel light lenses configured to convert the laser beam from the laser light sources to second collimated laser beams;
a second optical fiber; and
a second condenser lens configured to converge and couple the second collimated laser beams with the second optical fiber.

12. A light source module according to claim 10, wherein an Abbe number of each of the second parallel light lenses is set to a second set value suppressing an output fluctuation from the second optical fiber to a predetermined value or less, the second set value determined based on: a transverse magnification defined by a focal length of a corresponding one of the second parallel light lenses and a focal length of the c second condenser lens; and a wavelength shift of a corresponding one of the light source module units.

13. A light source module according to claim 11, wherein an Abbe number of each of the second parallel light lenses is set to a second set value suppressing an output fluctuation from the second optical fiber to a predetermined value or less, the second set value determined based on: a transverse magnification defined by a focal length of a corresponding one of the second parallel light lenses and a focal length of the c second condenser lens; and a wavelength shift of a corresponding one of the light source module units.

14. The light source module according to claim 5, wherein the laser light sources comprise diode lasers having a wavelength from 0.3 μm to 0.55 μm.

\* \* \* \* \*